United States Patent
Horiguchi et al.

(10) Patent No.: US 6,774,430 B2
(45) Date of Patent: Aug. 10, 2004

(54) NON-VOLATILE SEMICONDUCTOR MEMORY DEVICE HAVING GATE INSULATING FILM WITH THICK END SECTIONS

(75) Inventors: Naoto Horiguchi, Kawasaki (JP); Toshiro Futatsugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/984,215

(22) Filed: Oct. 29, 2001

(65) Prior Publication Data

US 2002/0079533 A1 Jun. 27, 2002

(30) Foreign Application Priority Data

Dec. 27, 2000 (JP) ......................................... 2000-398509

(51) Int. Cl.⁷ ............................................. H01L 29/788

(52) U.S. Cl. ....................... 257/316; 257/317; 257/319; 257/320; 257/321

(58) Field of Search ................................. 257/315–317, 257/319–321, 411; 438/257, 263, 264, 261, 216, 287, 591, 954, 981

(56) References Cited

U.S. PATENT DOCUMENTS

| | | | | |
|---|---|---|---|---|
| 5,516,713 A | * | 5/1996 | Hsue et al. | 438/261 |
| 5,726,471 A | * | 3/1998 | Keller et al. | 257/316 |
| 6,136,653 A | * | 10/2000 | Sung et al. | 438/266 |
| 6,136,674 A | * | 10/2000 | An et al. | 438/585 |
| 6,225,661 B1 | * | 5/2001 | An et al. | 257/336 |
| 6,249,460 B1 | * | 6/2001 | Forbes et al. | 365/185.28 |

* cited by examiner

Primary Examiner—Thien F Tran
(74) Attorney, Agent, or Firm—Armstrong, Kratz, Quintos, Hanson & Brooks, LLP

(57) ABSTRACT

A non-volatile semiconductor memory comprising a semiconductor substrate, a gate insulating film formed on the substrate, and having a thin central section and thick end sections, a floating gate formed on the rate insulating film, an inter-electrode insulating film formed on the floating gate, a control gate formed on the inter-electrode insulating film, and source/drain regions formed in the substrate on both sides of the floating sate and having extensions extending under the thick end sections of the floating gate, and separated from the thin central section of the gate insulating film, wherein the thin central section enables tunneling of carriers at a low applied voltage, and thick end sections prevent tunneling of stored charges to the extensions and enhance retention of the stored charges.

10 Claims, 5 Drawing Sheets

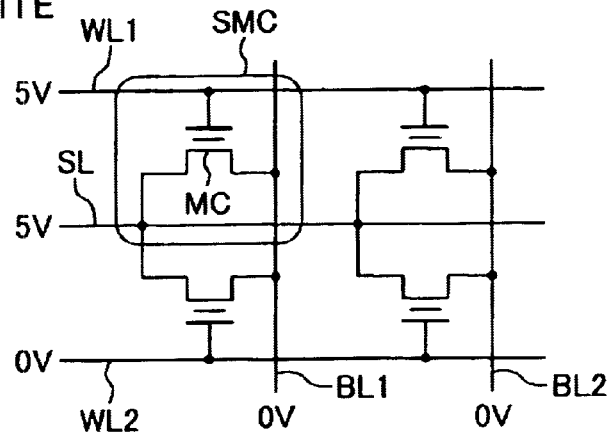
FIG.2A WRITE
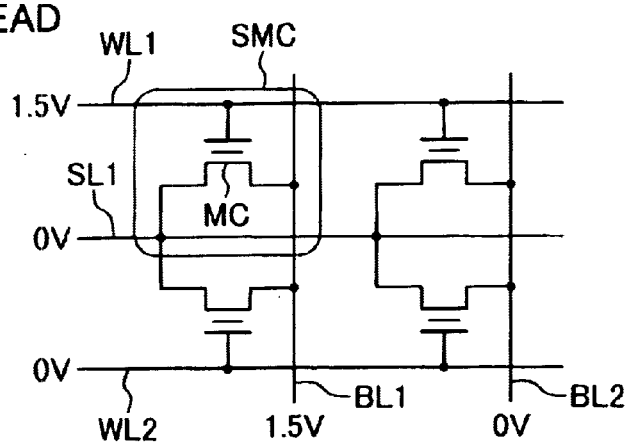
FIG.2B READ
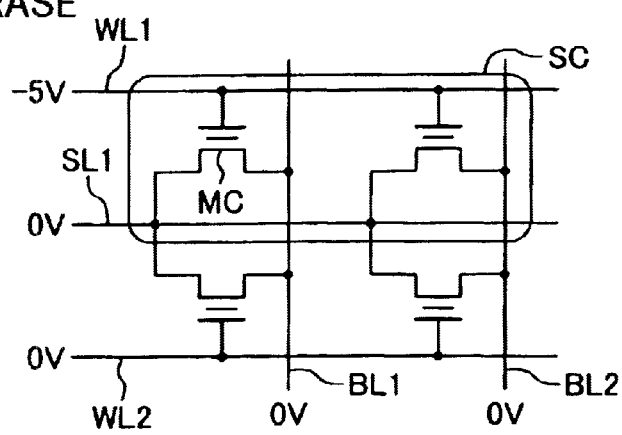
FIG.2C ERASE

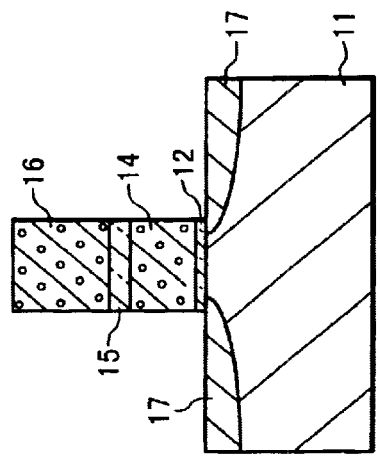 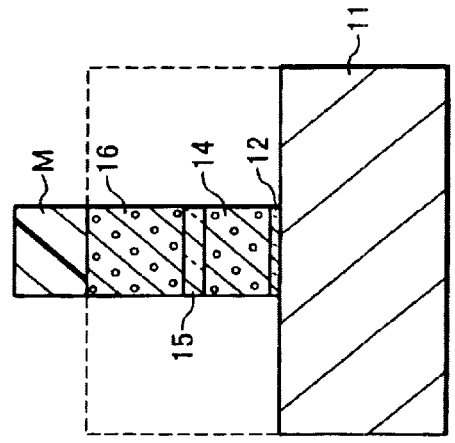 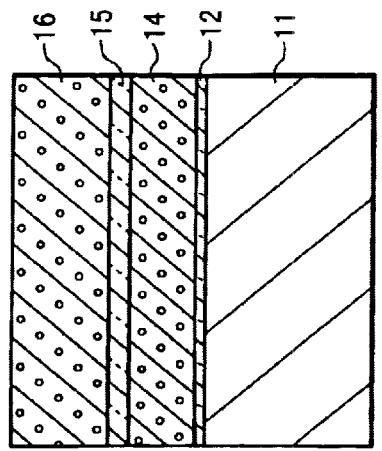
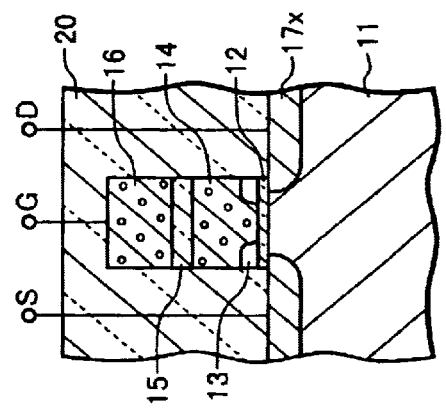 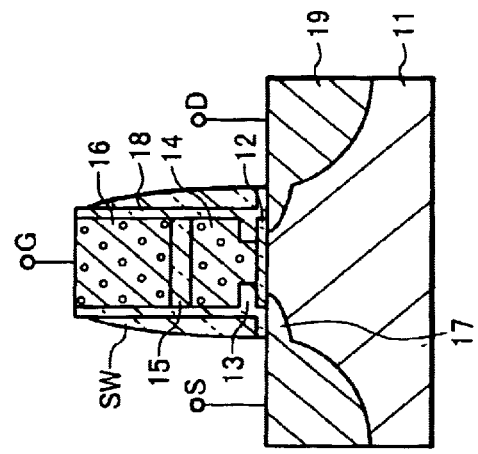 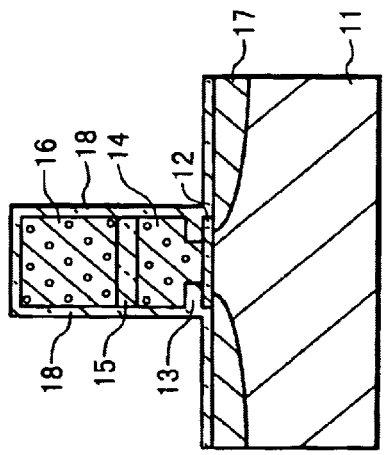
FIG.3A  FIG.3B  FIG.3C
FIG.3D  FIG.3E  FIG.3F

NON-VOLATILE SEMICONDUCTOR MEMORY DEVICE HAVING GATE INSULATING FILM WITH THICK END SECTIONS

CROSS REFERENCE TO RELATED APPLICATION

This application is based on and claims priority of Japanese patent application 2000-398509, filed on Dec. 27, 2000, all of the contents of which are incorporated herein by reference.

BACKGROUND OF THE INVENTION

1. Field of the Invention

The present invention relates to a semiconductor memory device and a method of manufacturing the same, and in particular, to a semiconductor memory device including stacked gate electrodes of which each includes a floating gate electrode and a control gate and a method of manufacturing the same.

2. Description of the Related Art

With development of the information society, a need exists to further increase the integration density of semiconductor memory devices. A flash memory includes a stack of a floating gate and a control gate above a channel region to form a non-volatile memory and hence does not require the refresh operation. Thanks to the advantage that the refresh operation is not required, the flash memory is employed in many electronic apparatuses. For a higher integration density and for a lower operation voltage of the flash memory, it is desired to lower the writing and erasing voltages.

In a flash memory, it is necessary for carriers to tunnel a tunnel oxide film of about 10 nanometer (nm) thickness between a channel and the floating gate. For the tunnel operation, a voltage of about plus or minus 10 volt (V) or more (in magnitude) is required. To lower the writing and erasing voltages, it is effective to minimize the film thickness of the tunnel oxide film.

When the film thickness is lowered to about 3 nm, the voltage necessary for carriers to tunnel the tunnel oxide film can be reduced to about plus or minus 5 V.

However, when the film thickness of the tunnel gate oxide film is minimized, carriers accumulated in the floating gate easily tunnel to extension region of the source/drain region applied with a relatively high voltage. This resultantly reduces the retention time for retaining carriers in the floating gate of the memory device.

A need exists for a semiconductor memory device in which the voltage for operating the device is lowered without reducing the information retention time.

SUMMARY OF THE INVENTION

It is therefore an object of the present invention to provide a semiconductor memory device in which the thickness of the tunnel oxide film can be reduced and the deterioration of the retention time can be reduced.

Another object of the present invention is to provide a method of manufacturing a semiconductor memory device of this kind.

According to one aspect of the present invention, there is provided a semiconductor memory device, comprising a semiconductor substrate including an active region of first conductive type; a gate insulating layer formed on said active region, said gate insulating layer including a thin central section and thick end section on each side thereof; a floating gate electrode formed on said gate insulating layer; an inter-electrode insulating layer formed on said floating gate electrode; a control gate electrode formed on said inter-electrode insulating layer; a pair of source/drain regions of second conductive type respectively extending in said active region from respective sides of said floating gate electrode respectively below said thick end sections, said source/drain regions being apart from said thick end section.

According to one aspect of the present invention, there is provided a method of manufacturing a semiconductor memory device, comprising the steps of: (a) forming a stack of a first gate insulating layer, a floating gate electrode layer, an inter-electrode insulating layer, and a control electrode layer on a semiconductor substrate including an active region of first conductivity type; (b) patterning said stack using a mask and thereby creating a gate electrode pattern; (c) causing a chemical reaction for said gate electrode pattern from both sides thereof and forming thereby a second gate insulating layer on each side of a central section of said first gate insulating layer, said second gate insulating layer being thicker than said first gate insulating layer; and (d) implanting ions of impurity of a second conductivity type in said active regions on both sides of said gate electrode pattern and forming thereby first source/drain regions respectively extending below said second insulating layers.

Since the thickness of the gate insulating film is increased in the vicinity of the source/drain region, the amount of a tunneling leakage current from the floating gate electrode to the source/drain region is reduced.

This improves the information retaining capability of the semiconductor memory device

BRIEF DESCRIPTION OF THE DRAWINGS

The objects and features of the present invention will become more apparent from the consideration of the following detailed description taken in conjunction with the accompanying drawings in which:

FIGS. 2A to 2C are equivalent circuits for explaining operation of the semiconductor memory device shown in FIGS. 1A to 1D;

FIGS. 3A to 3F are cross-sectional views of a semiconductor substrate for explaining processes of manufacturing the semiconductor memory device in the embodiment;

DESCRIPTION OF THE PREFERRED EMBODIMENTS

Figure 1A:
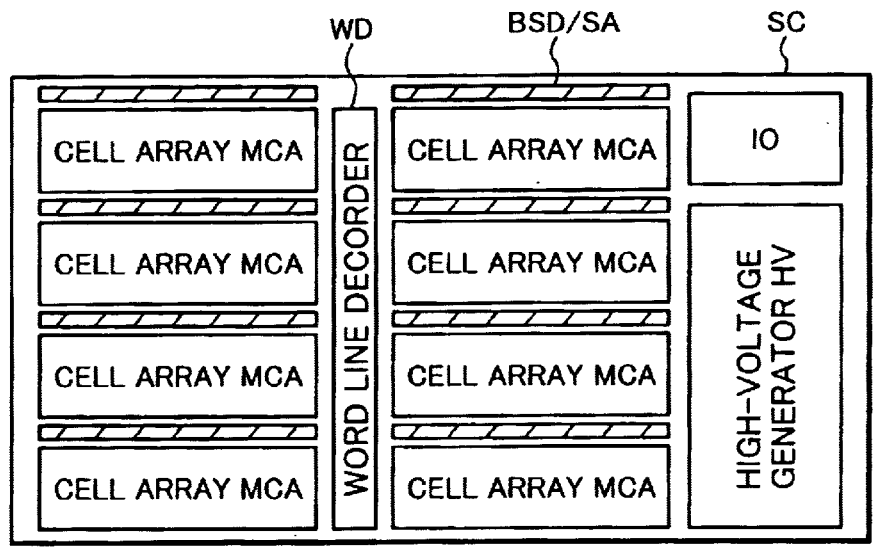
FIGS. 1A and 1B are plan views of a semiconductor memory device in an embodiment of the present invention.
Figure 1B:
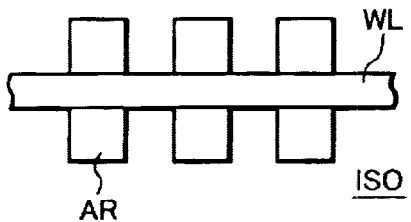
Figure 1D:
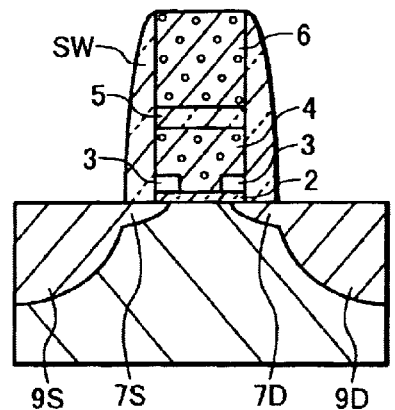
FIGS. 1C and 1D are an equivalent circuit diagram and a cross-sectional view thereof.

Description will now be given of an embodiment of the present invention by referring to the drawings. FIGS. 1A and 1B are plan views of a semiconductor memory device in an embodiment of the present invention and FIGS. 1C and 1D are an equivalent circuit diagram and a cross-sectional view thereof, respectively.

As shown in FIG. 1A, a silicon chip SC includes a plurality of memory cell arrays MCA; a plurality of regions BSD/SA each of which includes a bit line decoder, a source line decoder, and a sense amplifier circuit; a word line decoder WD, a high-voltage generator circuit HV, and an input/output circuit I/O. Each memory cell array includes a plurality of memory cells arranged in a matrix.

FIG. 1B shows a layout example of the memory cell array. A device isolation zone ISO defines a plurality of active regions AR, and a word line WL is disposed to intersect a central section of each active region AR.

Figure 1C:
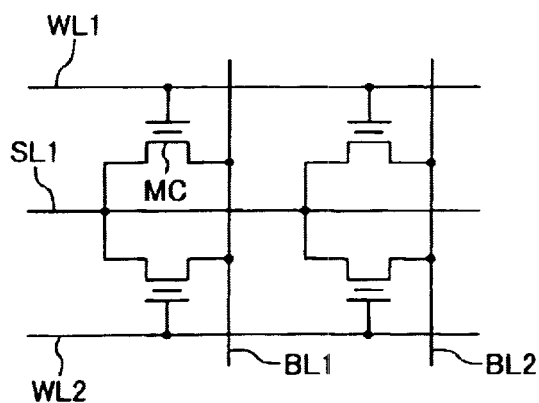

FIG. 1C is an equivalent circuit diagram showing part of the configuration of the memory cell array. The memory cells MC are arranged in a matrix form, and a gate electrode of each memory cell MC is connected to an associated word line WL1 or WL2. A source region of each memory cell MC is connected to a source line SL1. A drain region of each memory cell MC is connected to an associated bit line BL1 or BL2.

Operation of each memory cell MC is controlled by potential of the associated word line WL connected to its gate electrode, potential of the associated source line SL connected to its source region, and potential of the associated bit line BL connected to its drain region. In the erase and write operations, a relatively high voltage is applied between or is developed across the gate electrode and the channel region.

FIG. 1D is a cross-sectional view showing construction of each memory, cell MC. On a surface of a silicon substrate 1 including a p-type region, a thin tunnel oxide film 2 and thick tunnel oxide films 3 on both sides thereof are formed, which collectively constitute a gate insulation film. Formed on the gate insulation film 2, 3 is a floating gate electrode 4 on which a control gate electrode 6 is formed with an inter-electrode insulating film 5 interposed therebetween. The control gate electrode 6, the inter-electrode insulating film 5, the floating gate electrode 4, and the gate insulating film 2, 3 configure insulated gate electrode structure.

Formed on sidewalls of the insulated gate electrode structure are sidewall insulating spacers SW. Extension regions 7S and 7D respectively of the source and drain regions are formed to be self-aligned to the insulated gate electrode structure, and source/drain contact regions 9S and 9D are formed to be self-aligned to outer sidewalls respectively of the sidewall insulating spacers SW.

Since the floating gate electrode 4 is isolated from the source and drain extension regions 7S and 7D by the thick tunnel insulating film 3, the tunnel leakage current is prevented and the memory state of the floating gate electrode 4 can be kept retained for a long period of time. In the central section of the floating gate electrode 4, since the thin tunnel insulating film 2 is disposed between the floating gate electrode 4 and the channel region, the write and erase operations can be achieved with a low driving voltage.

FIGS. 2A to 2C are equivalent circuit diagrams for explaining operation of the semiconductor memory device shown in FIGS. 1A to 1D. FIG. 2A shows driving voltages for the write operation. In this case, information is written in a selected memory cell (SMC). A voltage of 5 V is applied to the word line WL1 and the source line SL. The bit line BL1 is kept at 0 V. Electrons induced in the channel tunnel or pass through the tunnel insulating film and enter the floating gate electrode.

In this regard, the bit lines, e.g., the bit line BL2 not used for the write operation are kept at 5 V such that electrons are not induced in the channel to thereby prevent the tunneling of electrons into the floating gate region. The word lines, e.g., the word line WL2 associated with the non-selected memory cells in a selected column, which includes the cell to be subjected to the write operation, are kept at 0 V such that electrons do not enter the floating gate region.

FIG. 2B shows an example of driving voltages for reading the contents of the memory cell for which the write operation has been achieved. The word line WL1 is set to 1.5 V and the source line SL1 is set to 0 V. A voltage of 1.5 V is then applied to the bit line BL1. If electrons are not beforehand stored in the floating gate, a channel is induced below the gate electrode to which 1.5 V is applied, and hence electrons flow from the source to the drain. If electrons are beforehand stored in the floating gate, a channel is not induced below the gate electrode even when a voltage of 1.5 V is applied to the control gate, and the selected memory cell SMC is kept in the off state.

For non-selected memory cells in the row connected to the word line WL1 on which 1.5 V is applied to, the bit lines such as the bit line BL2 are kept at 0 V to prevent an electric current between the source and the drain. In the memory cells MC connected to the rows other than the row including the selected memory cell SMC, the gate electrode is kept at 0 V. This does not induce a channel in the memory cell and hence the memory cell is kept in the off state.

FIG. 2C shows an erase operation. In this operation, all memory cells belonging to the same row are erased. A voltage of −5 V is applied to the word line WL1 and a voltage of 0 V is applied to the source line SL1 and the bit lines BL1, BL2, etc. In each memory cell in which−5 V is applied to its control gate and its source and drain are kept at 0 V, electrons stored in the floating gate are repelled by a negative voltage of the control gate. The electrons therefore tunnel into the channel region. In the rows for which the erase operation is not to be conducted, the word lines such as WL2 are kept at 0 V and hence the electrons in the floating gates are kept retained.

Referring next to FIGS. 3A to 3F, 4A to 4F, and 5A to 5E, description will be given in more detail of a method of manufacturing a semiconductor memory device similar to that shown in FIG. 1D.

FIGS. 3A to 3F are cross-sectional views showing a method of manufacturing a semiconductor memory device in an embodiment of the present invention.

As shown in FIG. 3A, on a surface of a silicon substrate 11 including a p-type active region, a silicon oxynitride film 12, an $n^+$-type polycrystalline silicon layer 14, a silicon oxide layer 15, and an an $n^+$-type polycrystalline silicon layer 16 are stacked. The silicon oxynitride layer 12 is formed, for example, as follows. The p-type silicon substrate is heated up to about 800° C. in a dry oxidizing atmosphere to form a thermal oxide film of about 3 nm thickness. In an atmosphere of nitrogen oxide (NO), the substrate is then annealed at about 800° C. The $n^+$-type polycrystalline silicon layer 14 with a thickness of about 100 nm is formed by chemical vapor deposition (CVD). The film is doped to an $n^+$-type film by doping impurity in the process of CVD. Alternatively, after a polycrystalline silicon film is formed without impurity, the film is doped to an $n^+$-type film by ion implantation.

A silicon oxide layer 15 of about 10 nm thick is formed on a surface of the $n^+$-type polycrystalline silicon layer 14 by thermal oxidation or CVD. On the silicon oxide layer 15, an $n^+$-type polycrystalline silicon film 16 of about 100 nm thickness is formed by CVD. Impurity can be implanted in either ways as follows. During the film forming process, the film is doped at the same time. Or, after a non-doped polycrystalline silicon film is formed, the film is doped by ion implantation.

As shown in FIG. 3B, a photo-resist mask M is patterned on the polycrystalline silicon film 16. Using the resist mask M as an etching mask, stacked structure is patterned. The patterning is carried out for the polycrystalline silicon film 16, the silicon oxide film 15, polycrystalline silicon film 14, and the gate electrode film 12 using the mask M. Thereafter, the mask M is removed.

As shown in FIG. 3C, using the stacked structure as a mask, n-type impurity is implanted into the p-type region of the silicon substrate 11 to form source/drain regions 17.

In a case in which an ion implantation process is also conducted after the formation of the sidewall insulating spacers, the source/drain regions become source/drain extension regions.

As shown in FIG. 3D, after the ion implantation, an oxide film 18 of about 5 nm is formed on the silicon surface by thermal oxidation. At the interface between the silicon oxynitride layer 12 and the polycrystalline silicone film 14, the oxidation speed of the polycrystalline silicon is high. Therefore, a silicon oxide layer 13 grows in each side portion of the polycrystalline film 14 contacting the oxynitride layer 12 toward a central section thereof. That is, on each side portion of the polycrystalline silicon film 14 which serves as a floating gate, a silicon oxide layer 13 is formed on the oxynitride silicon layer 12. This elongates the distance between the floating gate and the channel region.

The thermal oxidation process is conducted such that the upper surfaces of the source/drain regions (extension regions) 17 are completely covered with the silicon oxide layer 13. Therefore, a gate insulating film formed by the stacked structure of the silicon oxynitride layer 12 and the silicon oxide layer 13 is interposed between each extension region and the floating gate region. This increases the overall thickness of the insulating film and hence prevents the leakage current.

As shown in FIG. 3E, a silicon oxide layer is deposited by CVD and then a certain thickness of the silicon oxide layer is etched by anisotropic etching, to remove the oxide layer on the planar area. On the sidewalls of the stacked gate structure, the sidewall insulating spacers SW remain. Using the stacked gate structure and the sidewall insulating spacers SW as a mask, an ion implantation process is conducted to form source/drain (contact) regions 19 having a large junction depth. Thereafter, an interlevel insulating film is formed, and contact holes are opened to expose the contact areas. A gate electrode G, a source electrode S, and a drain electrode D are formed in the contact holes.

In the description, the source/drain regions have the extension regions. However, there may also be used single drain structure. In this case, the ion implantation shown in FIG. 3C is conducted at a relatively high density. After the process of FIG. 3D is finished, an interlevel insulating film is formed.

FIG. 3F shows constitution of a memory cell in the single drain structure. The source/drain regions are constructed with n⁺-type silicon regions 17x formed by one ion plantation process. The sidewall insulating spacers are not formed. The stacked gate electrode is buried in the interlevel insulating layer 20. The source electrode S, the gate electrode G, and the drain electrode D are connected to the source region, the control gate region, and the drain region, respectively.

In the above configuration, the gate insulating film is formed of a silicon oxynitride layer, and a polycrystalline silicon layer is formed thereon. Resultantly, thermal oxidation is enhanced in a horizontal direction in the polycrystalline silicon layer at the interface between the gate insulating film and the polycrystalline silicon layer. A similar advantage can also be expected when the gate insulating film is formed of a silicon nitride film. In this case, it is enough if the gate insulating film 12 of FIG. 3A is formed of a silicon nitride film.

FIGS. 4A to 4F are schematic cross-sectional views to explain processes of manufacturing a semiconductor memory device in another embodiment of the present invention. After isolation regions are formed on a surface of a silicon substrate 21, a gate insulating film 22, a polycrystalline silicon film 24, an inter-electrode insulating film 25, and a polycrystalline silicon film 26 are formed. This is substantially the same in structure as that shown in FIG. 3A and can be formed in substantially the same process.

Figure 4A:
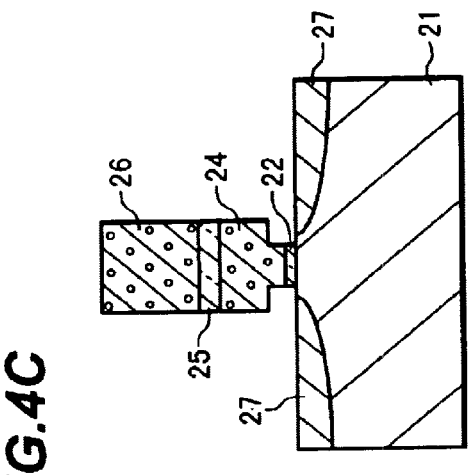
FIGS. 4A to 4F are cross-sectional views of a semiconductor substrate for explaining processes of manufacturing a semiconductor memory device in another embodiment of the present invention.
Figure 4B:
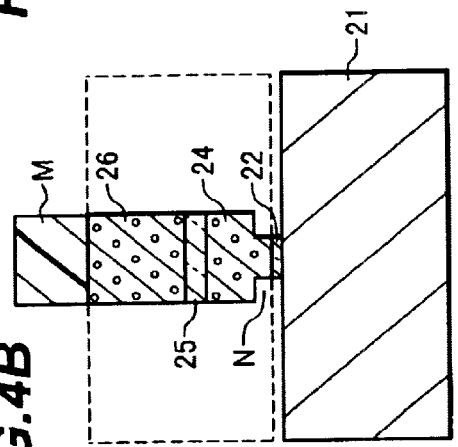

As shown in FIG. 4B, a resist mask M is formed on the polycrystalline silicon film 26. The stacked gate electrode structure is patterned by dry etching process using bromine-containing etchant under a relatively high gas pressure. It is to be understood that the etchant is changed when the inter-electrode insulating film 25 of silicon oxide is to be etched.

Figure 4C:
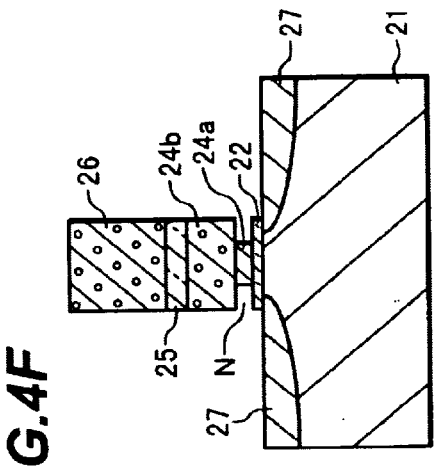

After the polycrystalline silicon film 24 for a floating gate is etched, notches N are formed in the polycrystalline silicon film 24 on the side of the gate insulating film 22 by over-etching. After the notches N are formed, the gate insulating film 22 of silicon oxide remaining on the surface of the silicon substrate is etched in a wet etching process using diluted hydrogen fluoride (HF), as shown in FIG. 4C.

Figure 4D:
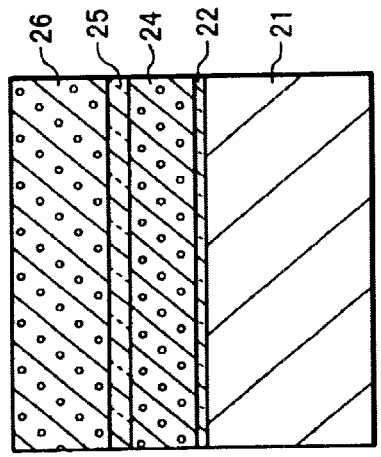

As shown in FIG. 4D, an insulating film for the sidewall insulating spacers SW is formed by CVD such that the notches N are filled with the insulating film. Thereafter, a certain thickness of the insulating film is etched by anisotropic dry etching to remove the insulating film on the planar surface areas. In this way, the sidewall insulating spacers SW are formed. In each notch N, an insulating region 23 is formed of the material of the sidewall insulating spacers SW.

The sidewall insulating spacers SW and the embedding insulating regions 23 are formed, for example, of silicon oxide.

The sidewall insulating spacers SW and the buried insulating regions 23 may also be formed of a silicon oxynitride layer. In this case, since silicon oxynitride has a higher dielectric contact than silicon oxide, although a thick gate insulating film exists on each side of the floating gate, effect of the gate voltage is enhanced. Therefore, the thick gate insulating film can function like a thin gate oxide film.

Figure 4E:
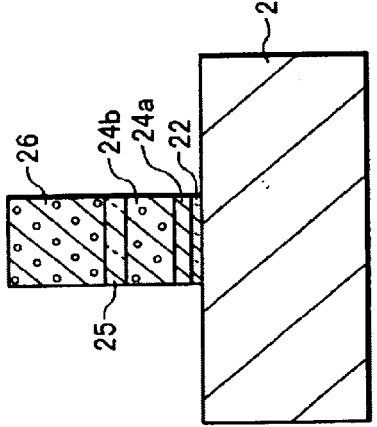

The notches may be formed in another method. FIG. 4E shows a gate electrode in which a metal nitride layer 24a of titanium nitride (TiN) or a tantalum nitride (TaN) is deposited on the gate insulating film 22, and a gate electrode layer 24b of polycrystalline silicon or the like is deposited on the metal nitride layer 24a. In this gate electrode structure, the lower gate electrode layer 24a can be selectively etched with respect to the upper gate electrode layer 24b.

Figure 4F:
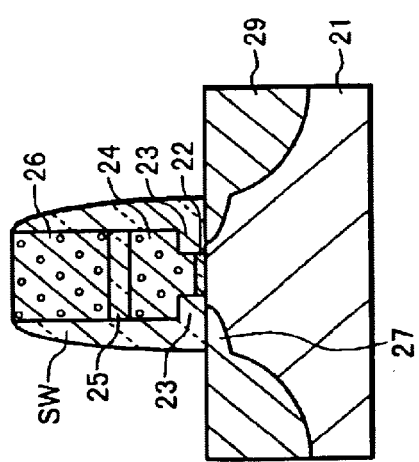

For example, after the stacked gate electrode structure is patterned using a photo resist mask as shown in FIG. 4B, when a sulfuric acid—hydrogen peroxide etching process is conducted, the lower gate electrode layer 24a of, e.g., titanium nitride (TiN) or tantalum nitride (TaN) is etched from its side surfaces. Resultantly, notches N are formed as shown in FIG. 4F. The gate oxide film 22 below the notches N may be removed or may be kept remained. In a subsequent process of FIG. 4D, an insulating film is filled in the notches N, and sidewall insulating spacers can be formed.

FIGS. 5A to 5E are cross-sectional views of a semiconductor substrate schematically showing processes of manufacturing a semiconductor memory device in another embodiment of the present invention.

Figure 5C:
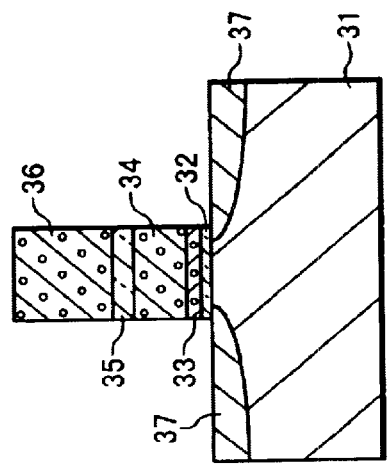
FIGS. 5A to 5E are cross-sectional views of a semiconductor substrate for explaining processes of manufacturing a semiconductor memory device in still another embodiment of the present invention.
Figure 5B:
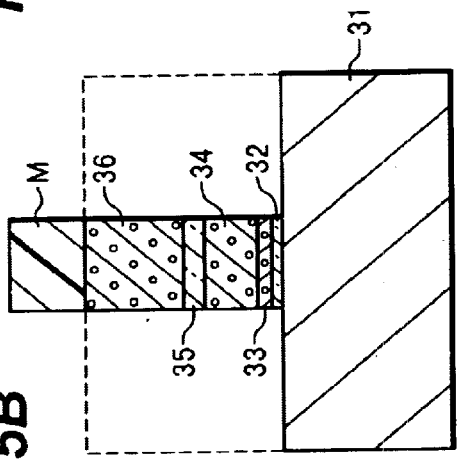
Figure 5E:
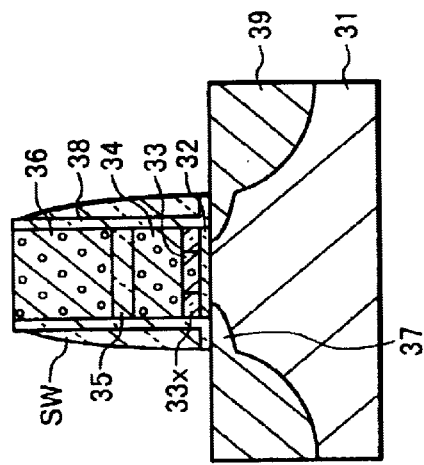
Figure 5A:
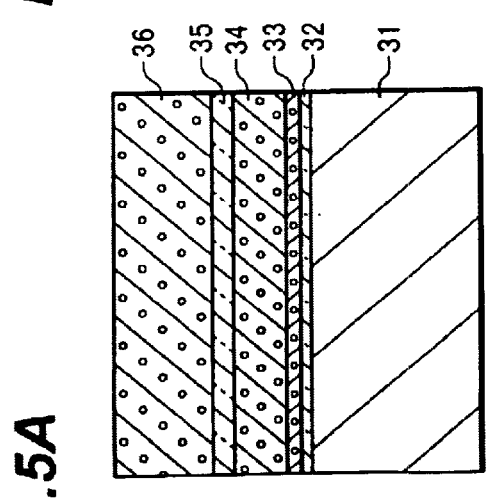

As shown in FIG. 5A, on a silicon substrate 31, a silicon oxide film 32, a polycrystalline, silicon-germanium (SiGe) mixed crystal layer 33, an $n^+$-type polycrystalline silicon layer 34, an inter-electrode insulating silicon oxide layer 35, and an $n^+$-type polycrystalline silicon layer 36 are formed. The silicon oxide layer 32 is formed, for example, to have a thickness of about 3 nm by thermal oxidation. The silicon-germanium mixed crystal layer 33 is formed to have a thickness of about 10 nm, for example, by CVD. The polycrystalline silicon layers 34 and 36 and the inter-electrode insulating silicon oxide layer 35 are formed in almost the same way as for the foregoing embodiments.

As shown in FIG. 5B, the polycrystalline silicon layer 36, the inter-electrode insulating silicon oxide layer 35, the polycrystalline silicon layer 34, the silicon-germanium mixed crystal layer 33, and the silicon oxide layer 32 are patterned using a resist mask M.

As shown in FIG. 5C, using the stacked gate electrode as a mask, n-type impurity ions are implanted onto the silicon substrate 31 to form source/drain regions 37.

Figure 5D:
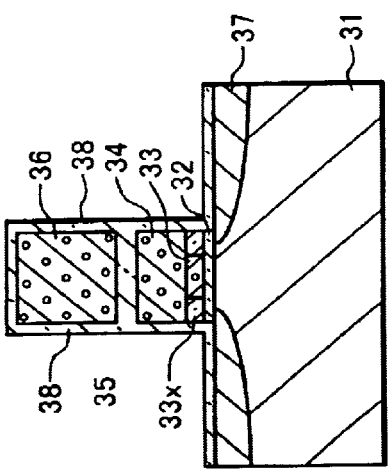

As shown in FIG. 5D, an oxide film of about 5 nm thickness is formed on a surface of the silicon substrate 31 by thermal oxidation. In the thermal oxidation, silicon-germanium (SiGe) mixed crystal has a higher oxidation rate than silicon (Si). Therefore, the silicon-germanium (SiGe) mixed crystal layer 33 is oxidized to a deeper position from both sides thereof below the polycrystalline silicon layer 34 which serves as a floating gate. Resultantly, an oxide layer of silicon-germanium or a silicon oxide layer 33x including germanium is formed. Below the polycrystalline silicon layer 34, the Si—Ge mixed crystal layer 33 remains in its central section.

As shown in FIG. 5E, after the sidewall insulating spacers SW are formed, source/drain regions 39 having a deeper junction than the extensions 37 are formed according to necessity. Below both side sections of the floating gate, a silicon oxide layer containing germanium of about 10 nm thickness is formed on a thin silicon oxide layer. This advantageously prevents the leakage current.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device, comprising:
   a semiconductor substrate including an active region of first conductive type;
   a gate insulating layer formed on said active region, said gate insulating layer including a thin central section of about 3 nm thickness and thick end sections on both sides thereof;
   a floating gate electrode formed on said gate insulating layer;
   an inter-electrode insulating layer formed on said floating gate electrode;
   a control gate electrode formed on said inter-electrode insulating layer;
   a pair of source/drain regions of second conductive type respectively extending in said active region from respective regions outside of said floating gate electrode respectively below said thick end sections, said source/drain regions being apart from said thin central section, wherein said source/drain regions, comprises:
   extension regions extended below said thick end sections; and
   source/drain contact regions respectively formed on both outside regions respectively of said extension regions, said source/drain contact regions having a junction depth exceeding a junction depth of said extension regions.

2. A semiconductor memory device according to claim 1, wherein each of said thick end sections of said gate insulating layer comprises a stack of a silicon oxide layer, a silicon oxynitride layer or a silicon nitride layer and a silicon oxide layer including germanium formed thereon.

3. A semiconductor memory device according to claim 1, wherein said floating gate electrode comprises a stack of a main floating electrode and a metal nitride layer disposed below a central and section of said main floating electrode.

4. A semiconductor memory device according to claim 1, wherein said floating gate electrode is made of polycrystalline silicon, and each of said thick end sections of said gate insulating layer comprises a stack of a silicon oxynitride layer or a silicon nitride layer formed on the semiconductor substrate and a silicon oxide layer formed thereon by thermal oxidation of said floating gate electrode.

5. A semiconductor memory device according to claim 4, further comprising:
   sidewall insulating spacers respectively formed to cover sidewalls of said control gate electrode, said inter-electrode insulating layer, and said floating gate electrode, wherein
   said extension regions are positionally aligned with said floating gate electrode; and
   said source/drain contact regions are positionally aligned respectively with outer sidewall surfaces of said sidewall insulating spacers.

6. A semiconductor memory device according to claim 1, further comprising:
   sidewall insulating spacers respectively formed to cover sidewalls of said control gate electrode, said inter-electrode insulating layer, and said floating gate electrode, wherein
   said extension regions are positionally aligned with said floating gate electrode; and
   said source/drain contact regions are positionally aligned respectively with outer sidewall surfaces of said sidewall insulating spacers.

7. A semiconductor memory device according to claim 6, wherein each of said thick end sections of said gate insulating layer comprises a stack of a silicon oxynitride layer or a silicon nitride layer and a silicon oxide layer formed thereon.

8. A semiconductor memory device according to claim 6, wherein each of said thick end sections of said gate insulating layer comprises a stack of a silicon oxide layer, a silicon oxynitride layer, or a silicon nitride layer and a silicon oxide layer including germanium formed thereof.

9. A semiconductor memory device according to claim 6, wherein said floating gate electrode comprises a stack of a main floating electrode and a metal nitride layer disposed below a central section of said main floating electrode.

10. A semiconductor memory device according to claim 6, wherein:
   said thin central section of said gate insulating layer is formed of a silicon oxide layer;
   said thick end sections respectively include regions of an insulator having a dielectric constant higher than a dielectric constant of said silicon oxide layer; and
   said sidewall insulating spacers are formed of the material of said insulator having a high dielectric constant.

* * * * *